United States Patent
Arghavani et al.

(10) Patent No.: US 6,514,879 B2
(45) Date of Patent: Feb. 4, 2003

(54) METHOD AND APPARATUS FOR DRY/CATALYTIC-WET STEAM OXIDATION OF SILICON

(75) Inventors: Reza Arghavani, Aloha, OR (US); Robert Chau, Beaverton, OR (US); Ron Dalesky, Cornelius, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/466,235

(22) Filed: Dec. 17, 1999

(65) Prior Publication Data

US 2002/0052123 A1 May 2, 2002

(51) Int. Cl.[7] ............... H01L 21/31; H01L 21/469; F23Q 2/08; C23C 16/00
(52) U.S. Cl. ............... 438/773; 438/774; 118/724; 432/131
(58) Field of Search ............... 438/770, 773, 438/774, 775; 432/131; 118/719, 724

(56) References Cited

U.S. PATENT DOCUMENTS

| | | | |
|---|---|---|---|
| 5,127,365 A | * 7/1992 | Koyama et al. | 118/724 |
| 5,234,501 A | * 8/1993 | Nakao et al. | 118/719 |
| 5,595,605 A | * 1/1997 | Tai et al. | 118/715 |
| 5,599,425 A | * 2/1997 | Lagendijk et al. | 156/646.1 |
| 5,763,922 A | * 6/1998 | Chau | 257/371 |
| 6,093,662 A | * 7/2000 | Ohmi et al. | 438/773 |

OTHER PUBLICATIONS

Tanabe et al. Diluted wet oxidation: a novel technique for ultra thin gate oxide formation, IEEE Semiconductor Manufacturing Conference Proceedings, pp. 49–52, Oct. 1997.*

* cited by examiner

Primary Examiner—Olik Chaudhuri
Assistant Examiner—Erik Kielin
(74) Attorney, Agent, or Firm—Blakely, Sokoloff, Taylor & Zafman LLP

(57) ABSTRACT

A configuration of various chemical compound generators coupled to a furnace provides the environment for formation of extremely thin oxides of silicon on a wafer. Dichloroethylene is reacted with oxygen in a first heated reaction chamber and reaction products therefrom are diluted with a gas such as nitrogen and then introduced into a vertically oriented furnace maintained at an elevated temperature and having rotating wafers therein. Hydrogen and oxygen are catalytically reacted to form steam in a second heated reaction chamber, the steam is diluted with a gas such as nitrogen and introduced into the vertical diffusion furnace. In a further aspect of the present invention, MOSFETs having gate dielectric layers of extremely thin oxides of silicon are formed.

16 Claims, 3 Drawing Sheets

METHOD AND APPARATUS FOR DRY/CATALYTIC-WET STEAM OXIDATION OF SILICON

BACKGROUND OF THE INVENTION

1. Field of the Invention

The present invention relates generally to semiconductor structures and manufacturing. More particularly, the invention relates to extremely thin dielectric layers and the methods and apparatus for the formation thereof.

2. Background

Advances in semiconductor manufacturing technology have led to the integration of millions of circuit elements, such as transistors, on a single integrated circuit (IC). In order to integrate increasing numbers of circuit elements onto an integrated circuit it has been necessary to reduce the line widths of the various parts that make up an integrated circuit. Not only have interconnect line widths become smaller, but so have the dimensions of metal-oxide-semiconductor field effect transistors (MOSFETs).

MOSFETs are also sometimes referred to as insulated gate field effect transistors (IGFETs). Most commonly, these devices are referred to simply as FETs, and are so referred to in this disclosure.

Transistor scaling typically involves more than just the linear reduction of the FET width and length. For example, both source/drain (S/D) junction depth and gate dielectric thickness are also typically reduced in order to produce a FET with the desired electrical characteristics.

Over the years, a substantial amount of research and development in the field semiconductor manufacturing has been dedicated to providing reduced thickness dielectric layers, as mentioned above. However, to be suitable for use as a MOSFET gate dielectric layer, these reduced thickness dielectric layers are typically required to provide certain electrical characteristics. For example, the dielectric layer should have a low density of interface states, a low density of defects, and a dielectric breakdown voltage high enough for use with the desired voltages that the MOSFET will encounter during operation. Furthermore, such a reduced thickness dielectric layer should be manufacturable with great uniformity and repeatability.

What is needed is an extremely thin dielectric layer suitable for use as the gate dielectric layer in a MOSFET, and what is further needed are apparatus and methods for repeatably making such ultra-thin dielectric layers.

SUMMARY OF THE INVENTION

Briefly, a configuration of various chemical compound generators coupled to a furnace provides the environment suitable for repeatably forming extremely thin oxides of silicon on a wafer with a high degree of uniformity.

In a further aspect of the present invention, MOSFETs having gate dielectric layers of extremely thin oxides of silicon are formed.

DETAILED DESCRIPTION

Terminology

Figure 1:
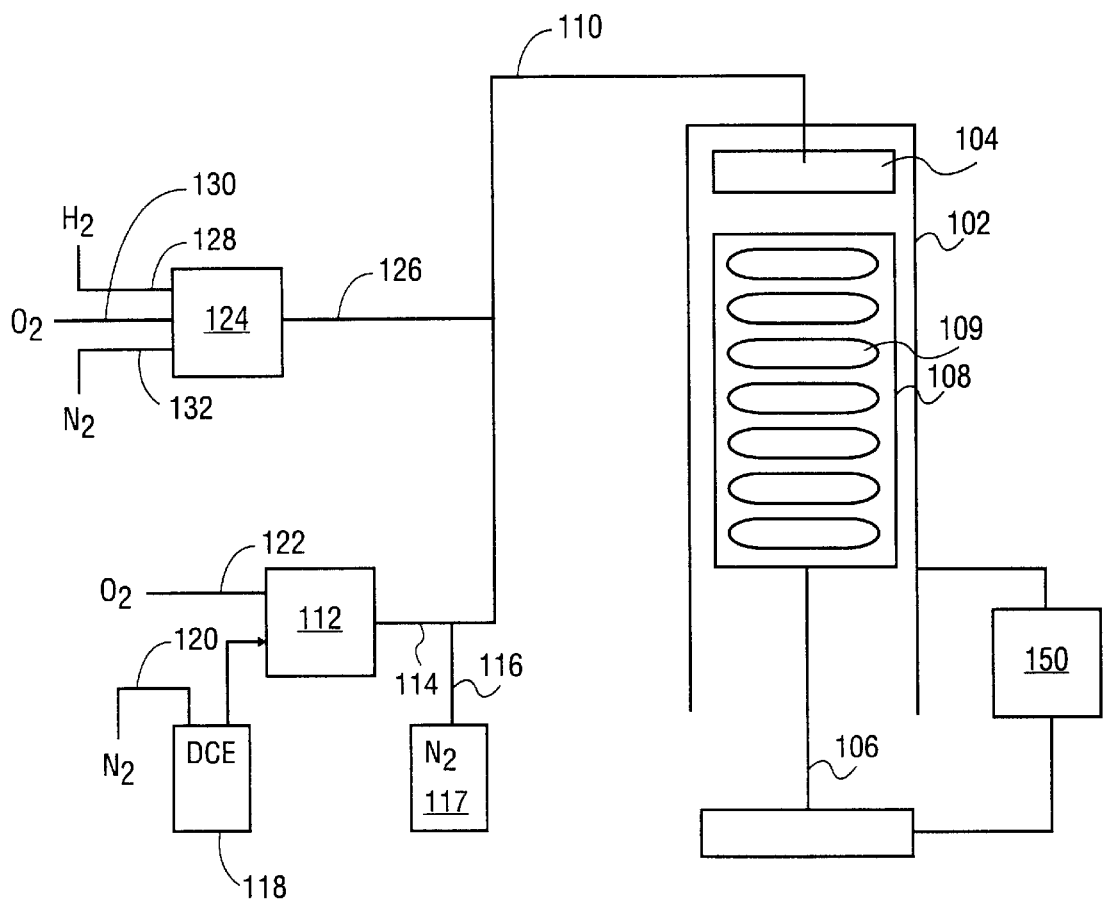
FIG. 1 is a schematic representation of a furnace and associated chemical compound generators coupled thereto in accordance with the present invention.

The terms, chip, integrated circuit, monolithic device, semiconductor device or component, microelectronic device or component, and similar terms and expressions are often used interchangeably in this field. The present invention is applicable to all the above as they are generally understood in the field.

Historically, the material most commonly used in the semiconductor industry to form the gate insulator layer of a FET is silicon dioxide. Thus, the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon often formed by chemical vapor deposition from a silicon source gas, or other methods, and has a structure that contains crystallites or domains with large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Overview

An arrangement of equipment, and methods of operation are disclosed for the formation of extremely thin oxides of silicon on a wafer. These oxides are formed with a high degree of uniformity both within wafer and wafer-to-wafer, and are electrically suitable for use as a gate dielectric layer.

In accordance with the present invention, a configuration of equipment for forming extremely thin oxides of silicon with excellent uniformity, both within wafer, and wafer-to-wafer, includes a first heated reaction chamber coupled to an $O_2$ source and a 1,2-dichloroethylene (DCE) source, such as, for example, a bubbler. The first reaction chamber has an output port coupled through a first pathway to a showerhead arrangement of a furnace. The first pathway is also coupled to a source of a diluting gas, such as, for example, nitrogen. A second heated reaction chamber having a metal catalyst therein is coupled to an $O_2$ source, an $H_2$ source, and an $N_2$ source. The second reaction chamber has an output port coupled to the showerhead arrangement of a furnace. The furnace is typically vertically oriented. In this orientation, the showerhead is typically at the top end of the furnace. The bottom end of the furnace typically has an opening through which it receives a container of wafers. Such a furnace is sometimes referred to in this industry as a vertical diffusion furnace (VDF) regardless of whether it is used for a diffusion operation or some other high temperature operation.

A method of forming a dielectric having a thickness of approximately 10 angstroms (1.0 nm) or less on a silicon substrate includes placing wafers into a furnace and performing a dry chlorinated oxidation operation, and a wet oxidation with steam. The wafers are rotated at approximately 3 rpm during the dry and wet oxidations and the furnace is maintained at approximately 625° C. In accordance with the present invention, both the dry and wet oxidation operations require the preparation of gases external to the furnace. In one reaction chamber, a reaction of 1,2-dichloroethylene and oxygen at elevated temperatures produces, primarily, HCl and $CO_2$, which together with other reaction products, $O_2$, and $N_2$, are passed to the showerhead of the furnace to begin the dry oxidation operation. In another reaction chamber, $H_2$ and $O_2$ are catalytically combined to form steam. The steam, together with nitrogen, is passed to the showerhead of the furnace to begin the wet oxidation operation. In this way, a dry/catalytic steam oxidation is accomplished.

Oxide Furnace Example

A first illustrative embodiment of the present invention is described below in connection with FIG. 1. As shown in FIG. 1, a vertically oriented furnace 102 has a showerhead arrangement 104, or more simply showerhead 104, at a top portion thereof so as to enable the introduction of various gases into furnace 102. A push mechanism 106 is used to push a wafer container 108 into furnace 102, and to move wafer container 108 back out again. Push mechanism 106 is adapted so that it may provide a rotational velocity to wafer container 108. Showerhead 104 is coupled to input plumbing 110. Input plumbing 110, in turn, is coupled to stainless steel plumbing 126, and to plumbing 114. Plumbing 114 is coupled to a diluting gas source 117 through plumbing 116. Plumbing 114 is further coupled to reaction chamber 112. Reaction chamber 112 is coupled to a 1,2-dichloroethylene (DCE) source 118, and an $O_2$ source 122. DCE source 118, in the illustrative embodiment of FIG. 1, is a bubbler which is further coupled to receive an $N_2$ carrier gas via plumbing 120. Stainless steel plumbing 126, which is adapted to maintain a particular temperature range, is coupled to reaction chamber 124. Reaction chamber 124 is coupled to $H_2$ source 128, $O_2$ source 130, and $N_2$ source 132. Those skilled in the art and having the benefit of this disclosure will appreciate that plumbing as used herein may be implemented as tubing, and that such tubing may be made from any of various materials suitable for the gases and temperatures used.

Reaction chamber 112 is adapted to receive DCE and $O_2$ and heat these gases. Reaction products such as HCl and $CO_2$, as well as unreacted $O_2$ exit reaction chamber 112 through plumbing 114. This stream of gases is then combined with at least one other gas in order to dilute the gases exiting from reaction chamber 112. In one embodiment of the present invention, $N_2$ is used to achieve this dilution. In this context, $N_2$ is referred to herein as a diluting gas.

Reaction chamber 124 is adapted to receive $H_2$ and $O_2$, and catalytically combine the $H_2$ and $O_2$ to produce steam. Reaction chamber 124 is further adapted to receive a diluting gas, in this case $N_2$. Additionally, reaction chamber 124 is adapted to couple the steam to plumbing 126. An $H_2$ detector may be is coupled to the output of reaction chamber 124. The $H_2$ detector may be coupled to an alarm such that when a predetermined amount of $H_2$ is detected an alarm is activated which notifies one or more operators, or may alternatively notify other equipment, that an unacceptable level of $H_2$ is contained in the gases which exit reaction chamber 124.

Furnace 102 is adapted to heat the wafers and gases introduced thereinto, and to maintain a particular temperature or temperature gradient. As indicated above, wafers 109 are introduced into furnace 102 by push mechanism 106 which delivers wafer container 108 into furnace 102. A furnace controller 150 is coupled to furnace 102 and push mechanism 106 and provides the control signals for setting and maintaining various temperatures for programmed times, as well as for providing control signals to push mechanism 106 which determine push rates, pull rates, and rotation speeds. Furnace controllers are well-known in this field and not described in further detail hereafter.

Oxide Formation Example

Figure 2:
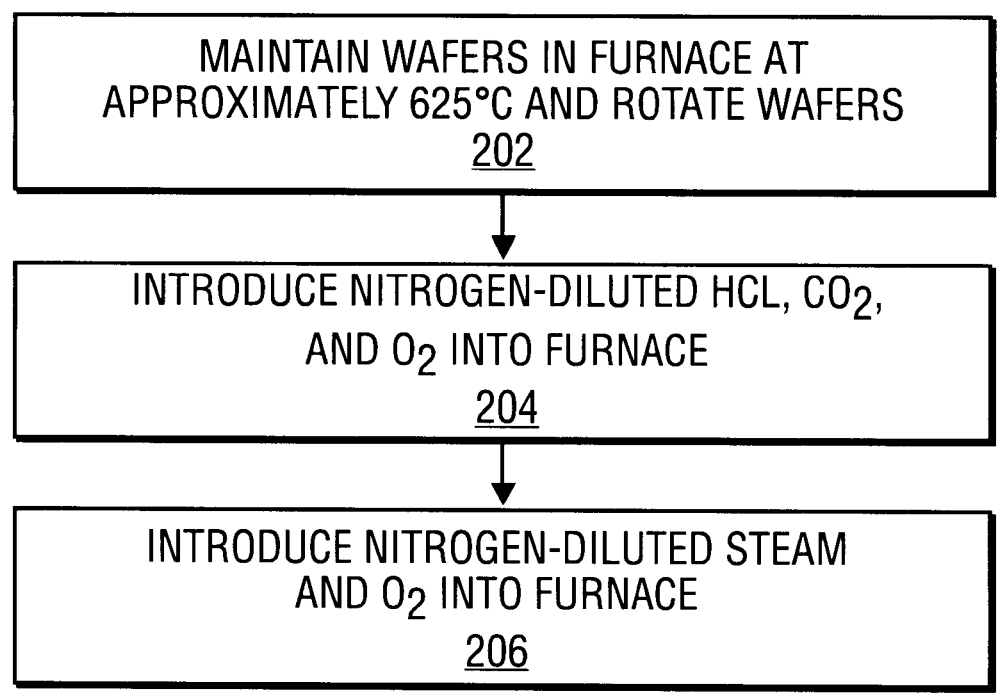
FIG. 2 is a flow diagram of a process in accordance with the present invention.

A first exemplary process for the formation of an oxide of silicon suitable for use as a MOSFET gate dielectric is described in conjunction with FIG. 2.

In this illustrative embodiment of the present invention, prior to beginning the dry and wet oxidation operations, the wafers are loaded in a wafer container, sometimes referred to as a boat, the boat is placed into a load lock chamber of the furnace, the load lock door is closed, the chamber is evacuated and purged with $N_2$. The boat is then pushed into the furnace tube with a 0.1 slpm $O_2$ flow and 9.9 slpm $N_2$ flow. The furnace temperature is then ramped up from approximately 500° C. to approximately 625° C. with a gas mixture flow of 0.1 slpm $O_2$, and 9.9 slpm $N_2$. Pushing the wafers into the furnace under these conditions forms a first amount of oxide on the surface of the wafers. This oxide is sometimes referred to as a push oxide because it forms while the wafers are being pushed into the furnace. The container of wafers is pushed into a vertically oriented furnace. Such a wafer container typically contains approximately 125 silicon wafers, with each wafer typically having a diameter of 200 mm (sometimes referred to in this field as eight inch wafers). Those skilled in the art will recognize that other wafer sizes, or a different number of wafers may be used with embodiments of the present invention. The wafer container is pushed into the furnace at a rate of approximately 500 mm per minute with the furnace at approximately 500° C., and a gas flow into the furnace of 0.1 slpm $O_2$, and 9.9 slpm $N_2$ being provided. The furnace temperature is then ramped up from 500° C. to 625° C., and a gas mixture flow of 0.1 slpm $O_2$, and 9.9 slpm $N_2$ is provided.

As shown in FIG. 2, in accordance with the present invention, the 200 mm wafers are rotated, and in this exemplary embodiment given a rotational velocity of approximately 3 rpm, and their temperature is maintained at approximately 625° C. (block 202). It is preferable to maintain temperature control of the furnace such that the gradient is less than or equal to 2° C. from one end of the furnace to the other. A first gas mixture including HCl, $CO_2$, and $O_2$, diluted with nitrogen is provided to the furnace from a showerhead arrangement at the top of the vertically-oriented furnace (block 204). This operational phase is referred to as a dry oxidation. The dry oxidation takes place for approximately 2 minutes. The wafers are rotated and maintained at this temperature, i.e., 625° C., with the first gas mixture provided at atmospheric pressure for a period of approximately 2 minutes, as mentioned above. The first gas mixture is obtained from the reaction of 1,2-dichloroethylene and oxygen at approximately 800° C. The 1,2-dichloroethylene is typically provided to a reaction chamber, in which it is combined with oxygen, from a bubbler using nitrogen as a carrier gas. HCl, and $CO_2$, are produced during this reaction. Nitrogen is fed through the bubbler at approximately 0.29 slpm, and $O_2$ is fed to the reaction chamber at approximately 2.71 slpm. The reaction products are combined with molecular nitrogen to dilute their concentration and piped to the showerhead of the furnace. The diluting nitrogen is supplied at a flow rate of approximately 20 slpm.

Still referring to FIG. 2, a second gas mixture is provided to the furnace (block 206). This second gas mixture is formed by the catalytic reaction of hydrogen and oxygen in the presence of nitrogen at approximately 500° C. Hydrogen is supplied to the catalytic reaction chamber at the rate of approximately 0.5 slpm, oxygen is supplied at the rate of approximately 0.98 slpm, and the diluting nitrogen is supplied at approximately 20 slpm. The second gas mixture includes steam, which is created by the reaction of hydrogen and oxygen, as well as nitrogen, and any unreacted precursor gases. This operational phase is referred to as a wet oxidation. The wet oxidation takes place for approximately 6 minutes. The second gas mixture is transferred to the furnace via plumbing, such as for example stainless steel tubing. In one embodiment of the present invention the second gas mixture is maintained at 180° C. as it passes through the stainless steel tubing on its way to the showerhead of the furnace. No significant amount of $H_2$ exits the catalytic reaction chamber.

Although the furnace is maintained at approximately 625° C. in the illustrative embodiment of the present invention, it is possible to maintain a temperature gradient through the furnace such that, for example, one end of the furnace is cooler and the other end is hotter. As is well-known in this field, modern furnace controllers provide users with the ability to program such temperature gradients, specifying times and temperatures.

Subsequent to the wet oxidation, the wafers are annealed in $N_2$ for approximately 30 minutes. Then the wafers are pulled out of the furnace. In this illustrative embodiment, the time taken for loading the wafers, pushing them into the furnace, completing the dry and wet oxidation operations, annealing, pulling the wafers out of the furnace and unloading is approximately 3.5 hours.

Figure 3:
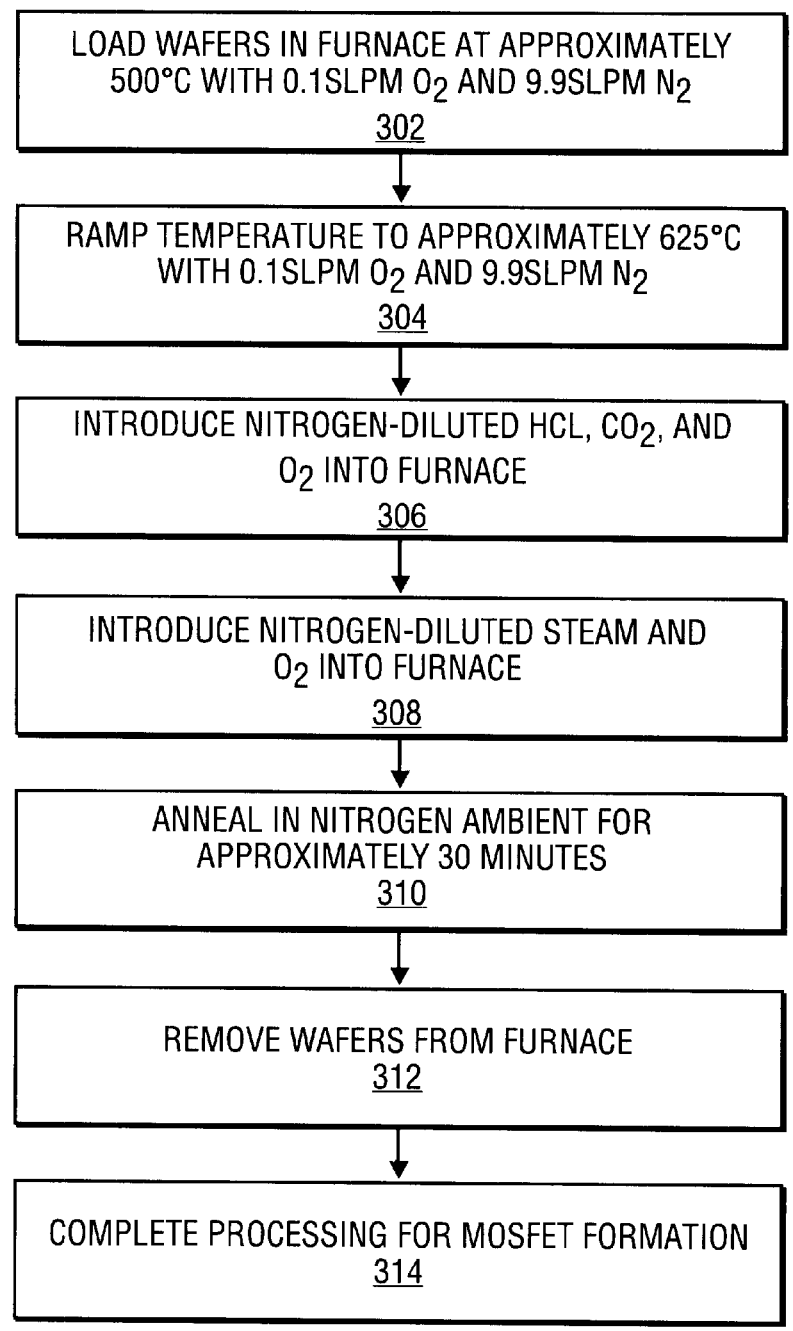
FIG. 3 is a flow diagram of a process in accordance with the present invention.

A second exemplary process for the formation of an oxide of silicon suitable for use as a MOSFET gate dielectric is described in conjunction with FIG. 3, and includes forming a gate electrode and source/drain terminals needed to complete a MOSFET. It will be appreciated that apparatus and methods in accordance with the present invention can produce gate dielectric layers suitable for both PFETs and NFETs.

Referring to FIG. 3, oxygen and nitrogen are provided to a vertically oriented furnace and wafers are pushed into the furnace at a rate of approximately 500 mm per minute (block 302) as the temperature is maintained at approximately 500° C. The furnace temperature is then ramped from approximately 500° C. to approximately 625° C. (304). The wafers are typically in a container and the container is pushed into the furnace by a mechanism which is also adapted to rotate the wafers by rotating the container. A container of approximately 125 eight-inch wafers is rotated at approximately 3 rpm. After the wafers are in the furnace, a dry oxidation operation is performed (block 306) in which a first gas mixture including HCl, $CO_2$, $N_2$, and $O_2$ is provided to the furnace, and a temperature of approximately 625° C. is maintained. The HCl and $CO_2$ are produced external to the furnace in a reaction chamber in which dichloroethylene and oxygen react at approximately 800° C. After approximately 2 minutes, the flow of the first gas mixture is stopped and a second gas mixture is provided to the furnace (block 308). The second gas mixture includes catalytically produced steam along with molecular nitrogen. The steam is maintained at approximately 180° C. as it is piped from the external catalytic reaction chamber to the furnace. After approximately 6 minutes, the flow of the second gas mixture is stopped and the wafers are subjected to a 30 minute anneal in a nitrogen ambient (block 310). Subsequently, the wafers are removed from the furnace (block 312).

Still referring to FIG. 3, after the oxide dielectric layer has been formed, conventional processing operations may be performed in order to form a gate electrode over the dielectric layer, and to form source/drain terminals substantially aligned with the gate electrode (block 314). For example, a layer of polysilicon may be formed of the oxide, patterned with a gate mask, to form one or more gate electrodes. Source/drain terminal formation can be accomplished by any of a number of well-known methods. For example, a first ion implantation, aligned to the gate electrode to form a source/drain extension can be performed, followed by formation of sidewall spacers along laterally opposed sides of a gate electrode, and followed in turn by a second ion implantation to form the deep portions of the source/drain terminals. Those skilled in the art will recognize that both NFETs and PFETs can be formed in this way. The type of dopant ions implanted depends of the type of transistor being formed. For example, PFETs have p-type source/drains which can be formed by dopants such as boron or indium. Similarly, NFETs have n-type source/drains which can be formed by dopants such as phosphorus, arsenic or antimony.

Various other layers of insulators and conducting material are formed above the gate level, as is well understood in the field of semiconductor manufacturing and integrated circuit design.

CONCLUSION

Embodiments of the present invention provide extremely thin dielectric layers. Dielectric layers less than or equal to approximately 11 angstroms, which are suitable for use as the gate insulating layer for FETs, are created in a dry/catalytic steam oxidation process which provides a uniformity 0.5 angstrom at 3σ.

It will be recognized by those skilled in the art and having the benefit of this disclosure that the present invention is applicable to the formation of both n-channel FETs (NFETs) and p-channel FETs (PFETs).

The present invention may be implemented with various changes and substitutions to the illustrated embodiments. For example, the present invention may be practiced with not only with silicon wafers as substrates, but also with other substrates, including but not limited to such substrates as silicon on insulator (SOI) Various other carrier and diluting gases may be substituted for nitrogen and provide substantially similarly results, however, nitrogen is typically preferred because it is much less expensive than other substantially inert gases. Furthermore, those skilled in the art and having the benefit of the present disclosure will recognize that times, temperatures, and rotational speeds may need to be varied to accommodate different size wafers (e.g., 300 mm diameter wafers) or different numbers of wafers in the furnace. Variation of these parameters in view of the present disclosure would be an undertaking which does not require undue experimentation by those skilled in the art.

Although specific embodiments, including specific equipment, parameters, methods and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A method of forming a dielectric having a thickness of approximately 1.0 nm or less on a silicon substrate, comprising:
    pushing a container of silicon wafers into a vertically oriented furnace at a controlled rate;
    rotating the wafers at a predetermined rate;
    ramping the furnace from about 500° C. to approximately 625° C.;
    maintaining the furnace at approximately 625° C.;
    producing a dry gas mixture including HCl, $CO_2$, and $O_2$ in a first reaction chamber;
    combining the dry gas mixture with a diluting gas to dilute the concentration of the dry gas mixture after the dry gas mixture exits the first reaction chamber;
    introducing the diluted dry gas mixture including HCl, $CO_2$, and $O_2$ into the furnace from the first reaction chamber to perform a dry oxidation process for a first time period;
    catalytically combining $H_2$ and $O_2$ in a second reaction chamber to form steam; and
    introducing the steam into the furnace to perform a wet oxidation process for a second time period.

2. The method of claim 1, wherein the controlled rate is approximately 500 mm per minute.

3. The method of claim 1, further comprising flowing a gas mixture of $O_2$ and $N_2$ into the furnace during ramping of the furnace.

4. The method of claim 1, further comprising passing the steam from the second reaction chamber to the furnace at approximately 180° C.

5. The method of claim 1, wherein catalytically combining $O_2$ and $H_2$ is performed at approximately 500° C.

6. The method of claim 1, wherein the first time period is about 2 minutes.

7. The method of claim 1, wherein the predetermined rate is approximately 3 rpm.

8. The method of claim 1, wherein the second time period is approximately 6 minutes.

9. A method of making a thin gate insulation layer for a field effect transistor, comprising:
    flowing oxygen and nitrogen into a vertically oriented furnace;
    pushing a container of wafers into the furnace at a controlled rate;
    rotating the wafers at a predetermined rate;
    ramping the furnace from about 500° C. to approximately 625° C.;
    maintaining the furnace at approximately 625° C.;
    producing a dry gas mixture including HCl, $CO_2$, and $O_2$ in a first reaction chamber;
    combining the dry gas mixture with a diluting gas to dilute the concentration of the dry gas mixture after the dry gas mixture exits the first reaction chamber and while the dry gas mixture is piped to the furnace;
    introducing the diluted dry gas mixture including HCl, $CO_2$ and $O_2$, into the furnace from the first reaction chamber to perform a dry oxidation process for a first time period;
    catalytically combining $H_2$, $O_2$, and $N_2$ in a second reaction chamber to form nitrogen diluted steam;
    introducing the nitrogen diluted steam, at approximately 180° C., into the furnace to perform a wet oxidation process for a second time period;
    removing the wafers from the furnace;
    patterning at least one gate electrode on the wafers; and
    forming source/drain terminals substantially adjacent the gate electrode.

10. The method of claim 9, further comprising nitridizing the thin gate insulation layer prior to patterning at least one gate electrode on the wafer.

11. The method of claim 9, wherein the first time period is approximately 2 minutes.

12. The method of claim 9, wherein the second time period is approximately 6 minutes.

13. The method of claim 9, wherein the controlled rate is approximately 500 mm per minute.

14. The method of claim 13, wherein the predetermined rate is approximately 3 rpm.

15. A method of forming a dielectric on silicon wafers comprising:
    pushing a container of silicon wafers into a vertically oriented furnace at 500 mm per minute with the furnace at approximately 500° C.;
    introducing a gas flow into the furnace of 0.1 slpm $O_2$, and 9.9 slpm $N_2$;
    rotating the wafers at 3 rpm;
    ramping the furnace from about 500° C. to approximately 625° C.;
    maintaining the furnace at approximately 625° C.;
    producing a dry gas mixture including HCl, $CO_2$, and $O_2$ in a first reaction chamber, the HCl and $CO_2$ being primarily produced by combining 1,2-dichloroethylene and $O_2$ at 800° C., the 1,2-dichloroethylene being delivered to the first reaction chamber from a bubbler using nitrogen as a carrier gas, said nitrogen fed through the bubbler at a rate of 0.29 slpm, and wherein the $O_2$ is fed to the first reaction chamber at a rate of 2.71 slpm;
    combining the dry gas mixture with a diluting gas to dilute the concentration of the dry gas mixture after the dry gas mixture exits the first reaction chamber, the diluting gas flowing at a rate of 20 slpm;
    introducing the diluted dry gas mixture including HCl, $CO_2$, and $O_2$ into the furnace from the first reaction chamber to perform a dry oxidation process for 2 minutes;
    catalytically combining $H_2$ and $O_2$, at approximately 500° C., in a second reaction chamber to form steam, the $H_2$ being supplied to the second reaction chamber at a rate of 0.5 slpm and the $O_2$ is supplied to the second reaction chamber at a rate of 0.98 slpm;
    diluting the steam with $N_2$;
    introducing the diluted steam into the furnace to perform a wet oxidation process for 6 minutes; and
    annealing the silicon wafers in $N_2$ for approximately 30 minutes.

16. The method of claim 15, wherein the diluting gas is $N_2$.

* * * * *